United States Patent [19]

Shekerjian et al.

[11] Patent Number: 4,861,563
[45] Date of Patent: Aug. 29, 1989

[54] VACUUM LOAD LOCK

[75] Inventors: Brian H. Shekerjian, Tempe; J. B. Price, Scottsdale, both of Ariz.

[73] Assignee: Spectrum CVD, Inc., Phoenix, Ariz.

[21] Appl. No.: 49,489

[22] Filed: May 14, 1987

[51] Int. Cl.⁴ .......................... B01J 19/08; C23F 1/02
[52] U.S. Cl. .......................... 422/186.05; 422/186.06; 422/906; 422/907; 156/345; 414/217; 414/222; 204/298
[58] Field of Search .................. 422/906, 186, 186.04, 422/186.05, 186.06, 907, 906; 156/345, 643, 646; 204/298 MC, 298 MD, 298 MB, 298 MR, 298 MO, 298 EM, 298 SC; 414/217, 222, 225, 226

[56] References Cited

U.S. PATENT DOCUMENTS

| | | | |
|---|---|---|---|
| 4,149,923 | 4/1979 | Uehara et al. | 156/345 |
| 4,208,159 | 6/1980 | Uehara et al. | 414/225 |
| 4,212,317 | 7/1980 | Patrick et al. | 414/217 |
| 4,252,595 | 2/1981 | Yamamoto et al. | 156/345 |
| 4,341,582 | 7/1982 | Kohman et al. | 156/345 |
| 4,487,678 | 12/1984 | Noguchi et al. | 204/298 |
| 4,563,240 | 1/1986 | Shibata et al. | 156/643 |
| 4,618,572 | 10/1986 | Lorenzelli et al. | 414/217 |
| 4,654,106 | 3/1987 | Davis et al. | 156/345 |
| 4,664,797 | 5/1987 | Kudo et al. | 422/186.05 X |
| 4,747,928 | 5/1988 | Takahashi et al. | 414/225 |

*Primary Examiner*—John F. Terapane
*Assistant Examiner*—Susan Wolffe
*Attorney, Agent, or Firm*—Paul F. Wille

[57] ABSTRACT

A compact load lock and processing chamber is disclosed in which a moveable member forms a closure for both a load lock volume and an article processing volume. The moveable member is connected to fixed members by a flexible diaphragm which provides a non-sliding seal.

5 Claims, 2 Drawing Sheets

VACUUM LOAD LOCK

BACKGROUND OF THE INVENTION

This invention relates to apparatus for processing semiconductor wafers in a vacuum and, in particular, to a compact apparatus having fewer joints and chambers than previous designs.

In the semiconductor industry, as in others, contamination by unwanted particles remains a continuing problem. Source of particles are legion and equipment makers continuously seek ways to reduce contamination. One approach, the "clean room", has been refined over the years to the point where a room in which wafers are processed is made very clean, and very expensive, even without any equipment in it.

In processes where a wafer is treated under vacuum, e.g. plasma etch or deposition, annealing, sputtering, etc., one has the potential of obtaining a very clean, and small, environment for the wafers. One approach in this area, for example as shown by U.S. Pat. No. 4,487,678, is to provide load locks for the wafers, i.e. one or more intermediate chambers isolate the processing chamber from ambient atmosphere. While this does provide good control over the local atmosphere, adjacent the wafers, the number of seals which must be made and broken to obtain this control reduces the overall reliability of the equipment as well as increase its cost. Further, in the event of a failure or routine maintenance, the process chamber is usually opened to atmosphere. Thus, one must carefully purge all the chambers to obtain the benefits of the several load locks. The purging can take a considerable length of time, depending roughly on the volume to be purged.

Load locks of the prior art are typically separated from each other, or ambient pressure, by gate valves. These valves require additional mechanization. As such, there are additional moving parts right at a location through which the wafer passes on its way to or from processing. The additional complexity produces particles which can contaminate the wafer. Thus, even if gases deleterious to a process are removed, contamination of the wafer can still occur.

In view of the foregoing, it is therefore an object of the present invention to provide a plasma reactor having two chambers isolated from each other without the use of a gate valve.

Another object of the present invention is to provide an improved plasma reactor apparatus having minimal volume for purging.

A further object of the present invention is to provide an improved plasma reactor apparatus in which contamination from particles is minimized.

SUMMARY OF THE INVENTION

The foregoing objects are achieved in the present invention wherein a cup-shaped enclosure for a process chamber is contained within a slightly larger chamber for receiving semiconductor wafers to be processed. The larger chamber is bounded by surfaces defining a relatively small volume for the amount of surface area of those surfaces. Stated another way, the chamber is relatively flat. The open end of the process chamber seals against one of said surfaces prior to initiation of the process. A flexible diaphragm attached to the cup-shaped enclosure serves as one of the surfaces to enable motion of the cup-shaped enclosure without rubbing.

BRIEF DESCRIPTION OF THE DRAWINGS

A more complete understanding of the present invention can be obtained by considering the following detailed description in conjunction with the accompanying drawings, in which.

DETAILED DESCRIPTION OF THE INVENTION

Figure 1:
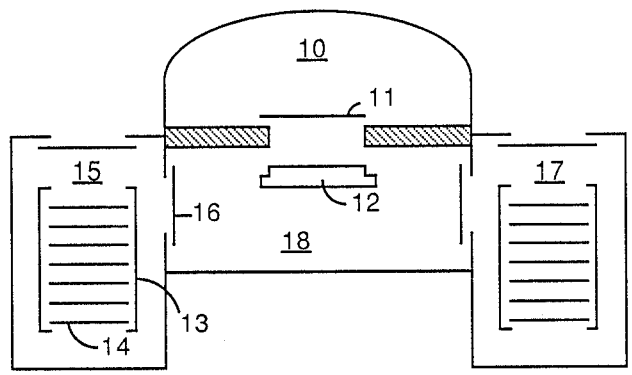
FIG. 1 illustrates a plasma reactor in accordance with the prior art.

FIG. 1 illustrates a typical reactor of the prior art wherein reactor chamber 10 comprises an upper electrode 11 and a lower electrode 12. Lower electrode 12 receives wafers from cassette 13. Typically, wafers 14 are loaded one at a time onto lower electrode 12 for processing within reactor 10. Cassette 13 is contained within a load lock having valve 15 through which cassette 13 is inserted and removed and valve 16 through which wafers 14 are transferred to electrode 12.

As described thus far, plasma reactor 10 comprises what is known as a single-ended machine. Frequently, a second load lock 17 is provided for receiving the wafers after processing. Load lock 17 also comprises gate valves isolating it from external gases as well as from the gases within chamber 18. As indicated in FIG. 1, the load locks and chamber 18 represent a significant volume in addition to the volume of chamber 10. Further, the wafers pass through at least one gate valve, such as gate valve 16, going to and coming from electrode 12. Thus, in addition to the volume of the chamber which must be purged, there is significant opportunity for particle formation and for contamination of the wafers.

Figure 2:
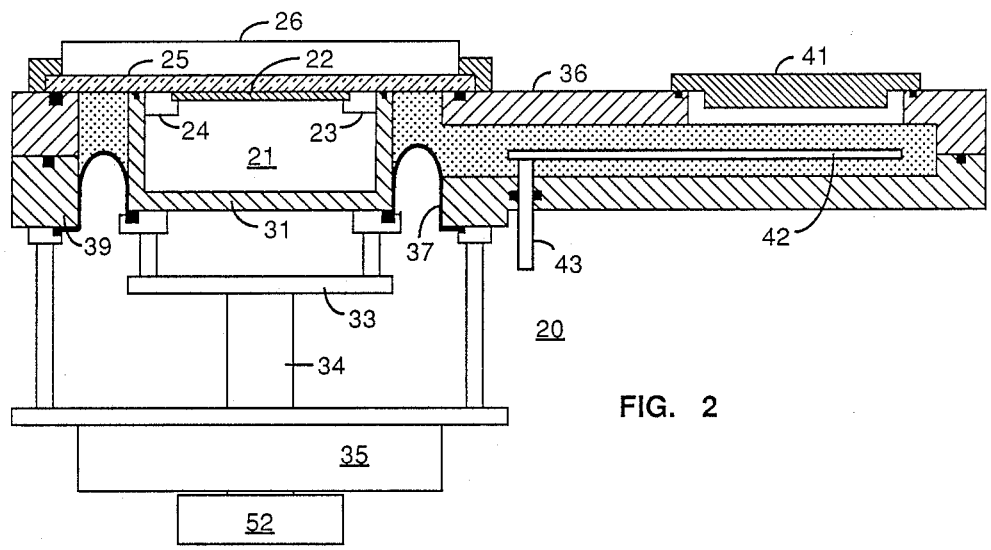
FIG. 2 illustrates a plasma reactor in accordance with the present invention.

These problems are significantly reduced or eliminated in accordance with the present invention, as illustrated in FIG. 2. In accordance with a preferred embodiment of the present invention, plasma reactor 20 has a reactor chamber 21 which is supplied with gases and exhausted through suitable apertures, not shown. Wafer 22 is held in place by tines 23 and 24, which hold wafer 22 against translucent plate 25. In chemical vapor deposition equipment, wafer 22 is heated by a suitable heater mechanism 26 which may comprise, for example, a plurality of lamps.

Chamber 21 is formed by member 31 having a raised edge portion which seals against translucent plate 25. Cup-shaped member 31 is connected to support 33 which in turn is coupled to column 34. Cup-shaped member 31 is raised and lowered by actuator 35 moving column 34 upwardly or downwardly. Actuator 35 may comprise any suitable mechanism such as a linear motor, hydraulic or pneumatic means, or a gear driven member. The volume surrounding support 33 and cup-shaped member 31 is divided by flexible membrane 37 which attaches about the periphery of member 31 and is connected to member 39. Members 36 and 39 extend to the right of chamber 21 and enclose a small volume which acts as a load lock through which wafers are transferred. A large aperture in the surface of member 36 is closed by cover plate 41. Cover plate 41 is moved into and out of position to expose spatula 42 for receiving or transferring wafers. Spatula 42 rotates on column 43 which passes through member 39.

Translucent plate 25 preferably comprises quartz for CVD applications and may comprise any other material compatible with the process being run. The various members defining the larger chamber formed can comprise aluminum and stainless steel. Membrane 37 preferably comprises elastomer, although other materials such as metals can be used instead.

Figure 3:
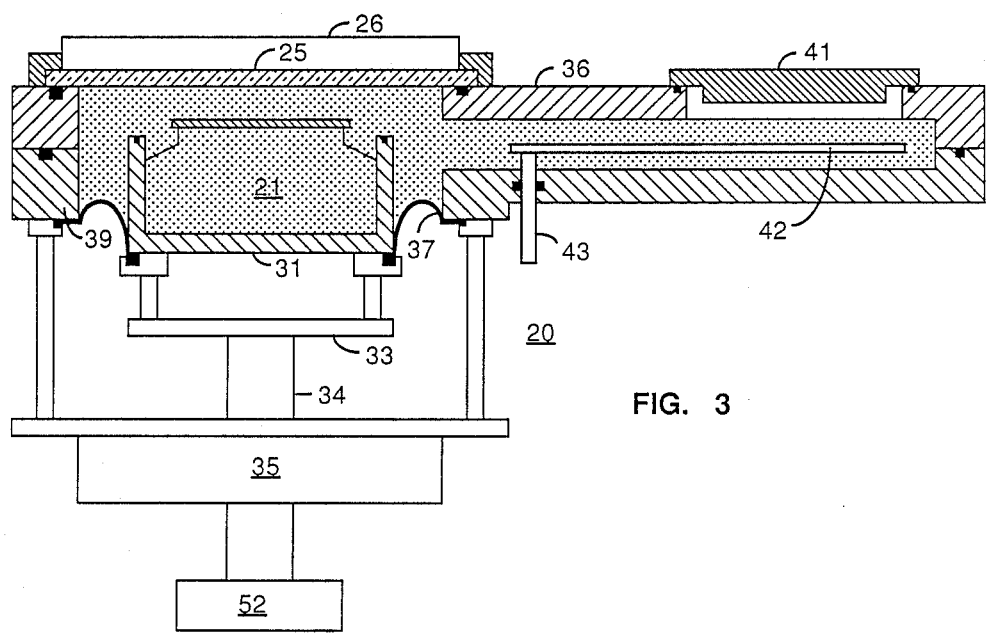
FIG. 3 illustrates a plasma reactor in accordance with the present invention.

The operation of the apparatus in accordance with the present invention may better be understood by considering FIGS. 2 and 3 together. FIG. 3 illustrates the present invention with member 31 displaced from translucent plate 25. In this position, there is but a single chamber enclosed by plate 25, member 39, membrane 37, member 31, member 36, and plate 41. Due to the operation of membrane 37 and the motion of member 31, this volume is slightly enlarged over the volume occupied by these components when member 31 is sealed against translucent plate 25.

At the start of a cycle the apparatus is configured as in FIG. 2, cover plate 41 opens and a wafer is loaded onto spatula 42. Cover plate 41 closes and the system is purged. Subsequently member 31 moves down from the quartz window and spatula 42 extends into the chamber, moving the wafer into position over tines 23 and 24. Actuator 48 then lifts the assembly slightly to receive the wafer so that the wafer clears spatula 42, which is returned to its rightmost position. Actuator 35 lifts the wafer further until it touches translucent plate 25. The tines flex and the raised edge portion of member 31 contacts plate 25, forming sealed chamber 21. Chamber 21 is further purged, a process is run, and the cycle reversed to transfer a wafer back through plate 41.

Figure 4:
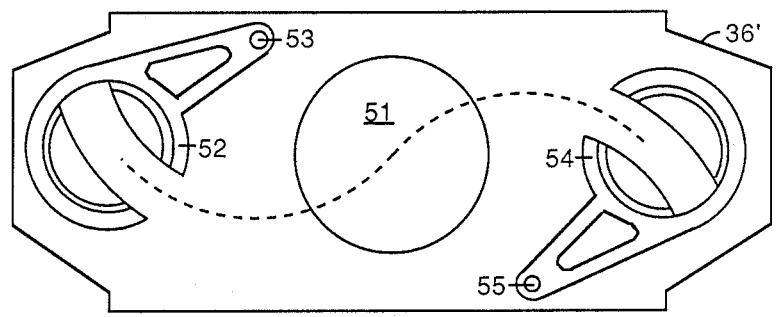
FIG. 4 illustrates an alternative embodiment of a plasma reactor in accordance with the present invention.

The embodiment illustrated in FIGS. 2 and 3 comprises a single-ended machine in which wafers are loaded and unloaded from one side. FIG. 4 illustrates an alternative embodiment in which a compact, double-ended machine is provided. In this embodiment, plate 36' comprises a central aperture 51 having spatula 52 positioned on one side thereof. Spatula 52 rotates about axis 53 to transport wafers to or from a chamber located above or below aperture 51. Similarly, spatula 54 rotates about axis 55 for supplying or removing wafers from the other side of the system. By providing a double-ended machine, one increases the rate at which wafers can be processed. Yet, by virtue of the embodiment illustrated in FIG. 4, this increase in speed is not obtained at a severe increase in volume. In one embodiment of the present invention, a machine constructed as illustrated in FIG. 2 enclosed a total volume, including the reactor chamber, of approximately four liters. This is in sharp contrast with machines of the prior art which typically enclose a volume of twenty-two liters or more.

There is thus provided by the present invention a compact apparatus which provides a relatively clean environment for the wafers without exacting a severe penalty in terms of the volume to be purged occasioned by opening the system. One thus obtains a machine that is relatively compact and less expensive to manufacture and use as compared to similar machines in the prior art. Further, the risk of particle contamination is minimized by eliminating gate valves and by moving the wafer in such a way that it avoids any area having sliding contact.

Having thus described the present invention, it will be apparent to those of ordinary skill in the art that various modifications can be made within the spirit and the scope of the present invention. As previously noted, the chambers of the present invention can be supplied with gases and exhausted by any suitable means known to those of skill in the art. While illustrated in FIGS. 2 and 3 as having a chamber below the wafer, the apparatus of the present invention is equally suited to a plasma reactor having the reactor chamber above the wafer. In such an embodiment, member 31 becomes the lower electrode and has membrane 37 attached to the lower portion thereof. While illustrated in FIG. 4 as on opposite sides of aperture 51, spatulas 52 and 54 could be located at any position. Instead of rotating, the spatulas could be configured to move linearly, e.g. by actuation from the side.

We claim:

1. Apparatus for subjecting a single wafer to a plasma glow discharge comprising:
   chamber means for substantially enclosing a first volume, said means being wider than it is high and having an aperture in a lower surface thereof;
   a first member for holding said wafer and having a maximum width less than the maximum width of said aperture and having a raised portion along the edge thereof extending into said chamber means; and
   flexible sealing means interconnecting said chamber means and the edge of said first member for closing said aperture;
   wherein said first member is movable within said volume so that the raised portion engages an upper surface of said chamber means to enclose a second, smaller volume within said first volume and in which said wafer is subjected to said discharge.

2. The apparatus as set forth in claim 1 and further comprising:
   actuator means, outside said first volume, for moving said first member through said aperture.

3. The apparatus as set forth in claim 1 wherein said chamber means has another aperture therein at a location displaced from the aperture in said lower surface, said other aperture providing access to said first volume for said wafer.

4. The apparatus as set forth in claim 3 and further comprising:
   transport means for moving said wafer within said first volume, between said other aperture and said aperture in the lower surface of said chamber means.

5. The apparatus as set forth in claim 4 wherein said transport means moves said wafer non-linearly.

* * * * *